(12) United States Patent
Bristow et al.

(10) Patent No.: US 6,754,868 B2
(45) Date of Patent: Jun. 22, 2004

(54) SEMICONDUCTOR TEST SYSTEM HAVING DOUBLE DATA RATE PIN SCRAMBLING

(75) Inventors: Steven R. Bristow, San Jose, CA (US);
Paul Magliocco, Los Gatos, CA (US);
Seth W. Craighead, San Jose, CA (US)

(73) Assignee: Nextest Systems Corporation, San Jose, CA (US)

( * ) Notice: Subject to any disclaimer, the term of this patent is extended or adjusted under 35 U.S.C. 154(b) by 515 days.

(21) Appl. No.: 09/895,439

(22) Filed: Jun. 29, 2001

(65) Prior Publication Data

US 2003/0005381 A1 Jan. 2, 2003

(51) Int. Cl.[7] .......................... G01R 31/28; G06F 11/00; G06F 1/04
(52) U.S. Cl. .................. 714/744; 713/600; 714/734
(58) Field of Search ................. 714/724, 733, 714/734, 738, 739, 744, 718, 719; 713/600

(56) References Cited

U.S. PATENT DOCUMENTS

| | | | |
|---|---|---|---|
| 5,101,153 A | * | 3/1992 | Morong, III ................ 324/537 |
| 5,761,216 A | * | 6/1998 | Sotome et al. ............... 714/738 |
| 5,917,331 A | | 6/1999 | Persons |
| 6,031,386 A | | 2/2000 | Cole, Jr. et al. |
| 6,101,458 A | | 8/2000 | Sugasawara et al. |
| 6,118,304 A | | 9/2000 | Potter et al. |
| 6,202,182 B1 | * | 3/2001 | Abramovici et al. ........ 714/725 |
| 6,246,250 B1 | | 6/2001 | Doherty et al. |
| 6,557,128 B1 | * | 4/2003 | Turnquist .................... 714/724 |

* cited by examiner

Primary Examiner—Christine T. Tu
(74) Attorney, Agent, or Firm—Dorsey & Whitney LLP (57) ABSTRACT

A method and apparatus are provided for high speed testing of devices having either logic circuits, memory arrays or both. Apparatus (100) includes: (i) pin electronics (P/Es 145) each coupling the apparatus to one of a number of pins (115) on device (110); (ii) timing and format circuits (T/Fs 150) for mapping a signal to one of P/Es (100); (iii) pattern generator (140) having a number of outputs for outputting signals for testing device (110); (iv) pin scrambling circuit (155) between pattern generator (140) and T/Fs (150), the pin scrambling circuit capable of mapping at least two signals from any of the pattern generator outputs to any of the T/Fs; and (v) clock (135) for providing a clock signal having a clock cycle to pattern generator (140) and T/Fs (150). T/Fs (150) are capable of switching the signals coupled to P/Es (100) at least twice each clock cycle.

23 Claims, 10 Drawing Sheets

SEMICONDUCTOR TEST SYSTEM HAVING DOUBLE DATA RATE PIN SCRAMBLING

FIELD

The present invention relates generally to a system for testing integrated circuits (ICs), and, more particularly, to a method and apparatus for high speed testing of ICs having either logic circuits, memory arrays or both.

BACKGROUND

Manufacturers in the electronic industry use test systems to automatically test various electronic components and integrated circuits (ICs) to weed out defective devices or ICs. Broadly, there are two types of test systems, those suitable for testing memory arrays or circuits, such as flash memory or Random Access Memories (RAM), those suitable for testing logic circuits, such as Micro Controllers, Application Specific ICs (ASICs), and Programmable Logic Devices (PLDs). Generally, it is desirable to test the ICs at several points during the manufacturing process including while they are still part of a wafer or substrate and after packaging the devices before they are mounted or assembled on modules, cards or boards. This repetitive testing imposes demands on test systems to automatically perform tests at high speed and with a high degree of accuracy. Moreover, the trend in the electronic industry has been to further increase the miniaturization of electronic devices and circuits, thereby allowing for an increase in the complexity of the IC. Thus, as ICs become more complex, the complexity of the test systems must increase correspondingly.

Figure 1:
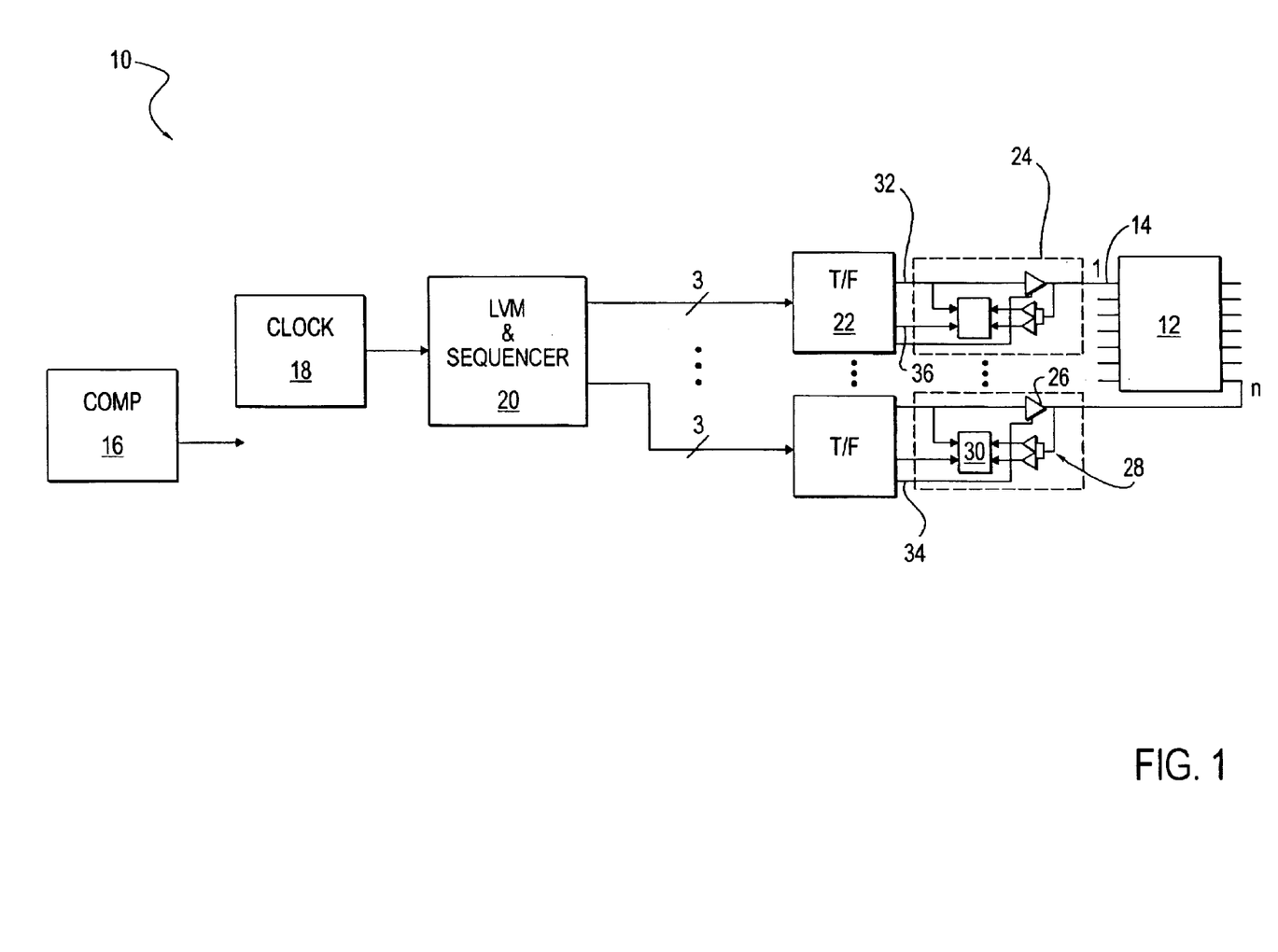
FIG. 1 (prior art) is a block diagram of a prior art test system for testing logic circuits.

An example of part of a prior art logic test system 10 for testing logic circuits in an IC, commonly known as a Device Under Test or DUT 12 having a number of pins 14 is shown in FIG. 1. Referring to FIG. 1, test system 10 typically includes a general purpose computer 16 or PC, a clock 18, logic vector memory (LVM 20) with a sequencer, a number of timing and format circuits (T/Fs 22), and a number of pin electronics or P/E channels 24. Computer 16 loads test programs and controls operation of other components of test system 10. Clock 18 generates system clocks and the test system period, which are provided to LVM 20, T/Fs 22, and other pipeline circuits in the test system. LVM 20 stores and sequences test signals, commonly known as test vectors, used during the testing process. T/Fs 22 adjust the timing and formatting of various signals, i.e., data, strobe and input/output (I/O) control signals, received from LVM 20 and couple the LVM to DUT 12, through PE channels 24. It should be noted that although test system 10 may include a single computer 16, clock 18 and LVM 20, it generally includes one T/F 22 and an associated P/E channel 24 for each pin 14 on a DUT 12, shown here as having pins 1 through n.

PE channels 24 typically include a PE driver 26 for applying a test vector, data, to a pin 14 of DUT 12, a comparator 28 for comparing a DUT output signal with an expected output signal, and an error logic circuit 30 for coupling results of the comparison back to error processing circuitry and and an error capture memory (not shown). Generally, PE driver 26 and comparator 28 are not active in the same PE channels 24 at the same time, since pin 14 is either receiving data or control signals or transmitting a result at a given time. PE channels 24 further include a data line 32 for coupling the test vectors from T/F 22 to PE driver 26 and error logic 30, an enable or control line 34 for enabling the PE driver to apply the test vector to DUT 12, and a strobe line 36 for enabling error logic 30.

Figure 2:
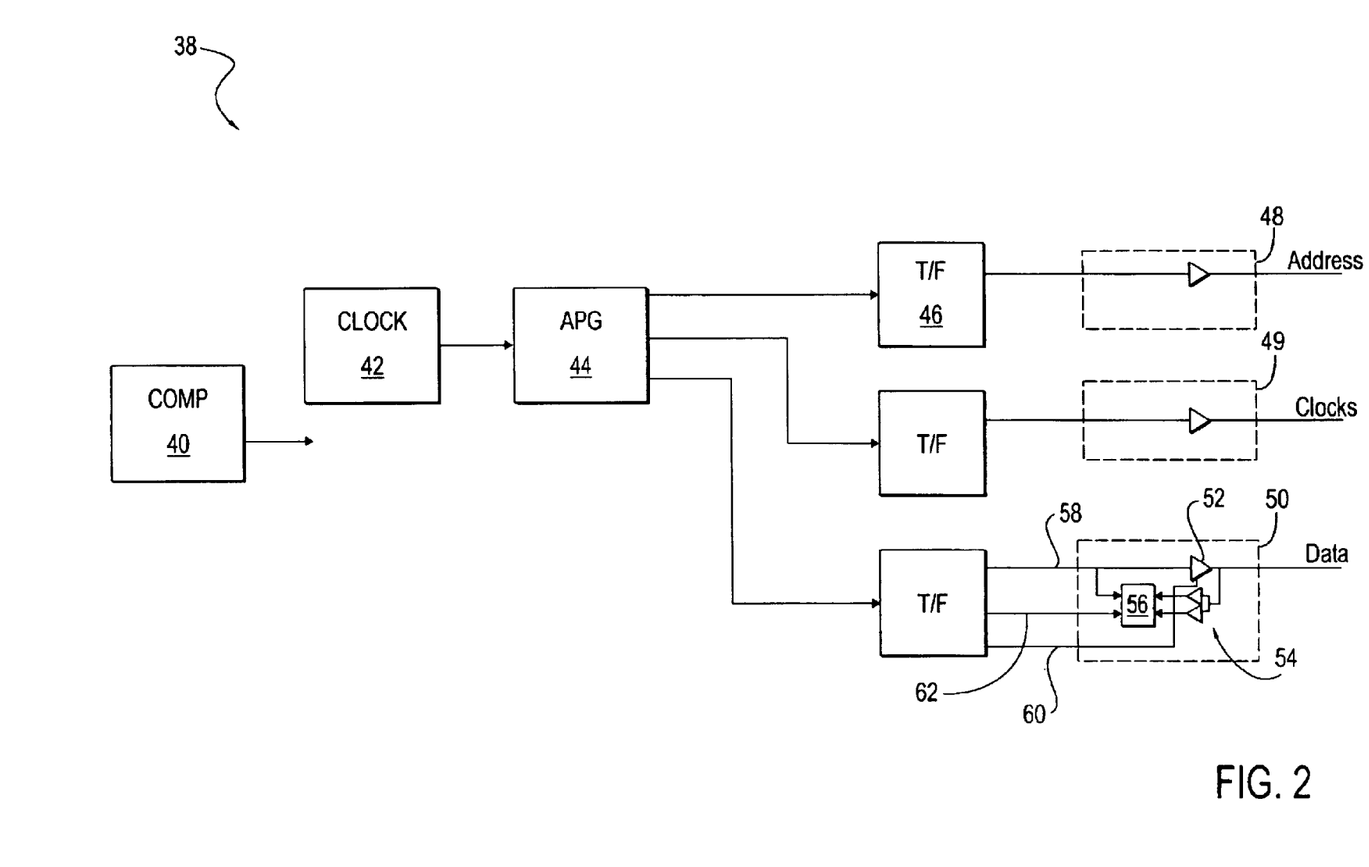
FIG. 2 (prior art) is a block diagram of a prior art test system for testing memory circuits.

An example of part of a prior art memory test system for testing memory arrays in DUTs is shown in FIG. 2. Referring to FIG. 2, the test system 38 typically includes a computer 40, a clock 42, an algorithmic pattern generator (APG 44), T/Fs 46, and P/E channels 48, 49, 50. APG 44 is used for generating a test signal or test vector for testing the memory array in the DUT. As above, it is to be noted that test system 38 further includes a single computer 40, clock 42 and APG 44, but a number of T/F 46 with associated P/E channel 48, 49, 50 for each pin on a DUT (not shown). For purposes of clarity, FIG. 2 illustrates only three T/Fs 46 and PE channels 48, 49, 50. PE channel 48 and PE channel 49 differ from PE channel 50 because they merely provide address and clock signals to the DUT and therefore require only a PE driver 52. PE channel 50 both provides data to and receives data from a pin on the DUT, and therefore includes, in addition to PE driver 52, a comparator 54, an error logic circuit 56 that functions as described above. PE driver 52 is coupled to T/F 46 by data line 58 and control line 60. Comparator 54 and error logic 56 are coupled to T/F 46 by strobe line 62 and data line 58.

A fundamental problem with the above test systems 10, 38 is their inability to easily test in parallel DUTs having a combination of both logic circuits and memory arrays.

Another problem with the above test systems 10, 38, is their inability to switch the pattern source signal coupled to the pin at least twice in each DUT cycle.

Yet another problem with the above test systems 10, 38, is their difficulty in testing DUTs having serial data paths.

Still another problem with the memory test system 38 described above, is the inability to route any output from the APG 44 to any PE channel 48, 49, 50, and therefore to any pin on the DUT. For example, in a test system 38 designed to accommodate 64 pin ICs, outputs from an address T/F may be mapped to any one address of address pins one through twenty-four, while outputs from a data T/F would be mapped to data pins twenty-five through fifty-six, and outputs from a clock T/F are mapped to pins fifty-seven through sixty-four. Thus, it is difficult if not impossible to reconfigure the test system 38 to accommodate DUTs having a different number of pins and/or arranged in a different configuration.

SUMMARY

The present invention is directed to an apparatus and method for high speed testing of integrated circuits (ICs) having either logic circuits, memory arrays or both.

In one aspect, the present invention is directed to an apparatus for testing a device under test (DUT). Generally, the apparatus includes: (i) a pattern generator having a number of outputs for outputting signals for testing the DUT; (ii) a number of pin electronics channels (P/Es) each coupling to one of a number of pins on the DUT; (iii) a number of timing and format circuits (T/Fs) for mapping signals to at least one of the P/Es; (iv) a pin scrambling circuit connected between the pattern generator and the T/Fs, the pin scrambling circuit capable of mapping at least two signals from any of the pattern generator outputs to any one of the T/Fs; and (v) a clock for providing a clock signal having a clock cycle to the pattern generator and the T/Fs. Preferably, the T/Fs are capable of switching the signals coupled to the P/Es at least twice in a clock cycle.

In one embodiment, the pattern generator includes logic vector memory (LVM) for testing logic circuits, and a memory signal source, such as an algorithmic pattern generator (APG), for testing memory arrays, and the scrambling circuit is capable of mapping signals from the LVM and the APG to separate T/Fs, thereby enabling the apparatus to simultaneously test one or more DUTs having logic circuits, memory arrays or both. Alternatively or additionally, the pattern generator can include a scan memory for serial type test interfaces or structural test.

In another embodiment, the pin scrambling circuit is capable of sequentially coupling signals on a number of the pattern generator outputs, generated in parallel, to one of the P/Es to test a DUT having a serial input. In one version of this embodiment, the pin scrambling circuit is capable of simultaneously coupling a number of signals to other pins on the DUT to simultaneously test DUTs having both serial and parallel inputs, such as for example NAND flash memories.

In another embodiment, a number of the apparatuses are capable of being linked to form a test system that can test DUTs having a number of pins at least greater than the number of the P/Es on any one of the individual apparatuses.

In another aspect, the present invention is directed to a method of testing a DUT using an apparatus having a clock, a pattern generator having a number of pattern generator outputs, and a number of pin electronics channels (P/Es). In the method, a clock signal having a clock cycle is provided using the clock, and signals for testing the DUT provided on the plurality of pattern generator outputs using the pattern generator. Each of a number of pins on the DUT are connected to one of the P/Es, and a signal from the plurality of pattern generator outputs coupled to at least one of the P/Es. The signal coupled to the P/E is switched at least twice each clock cycle, thereby providing an effective testing rate at least twice that of the clock cycle.

In one embodiment, the apparatus further includes a number of T/Fs each coupled between the pattern generator and one of the P/Es, and the step of coupling a signal to at least one of the P/Es involves coupling a signal from a T/F to at least one of the P/Es. In one version of this embodiment, the apparatus further includes a pin scrambling circuit connected between the pattern generator and the T/Fs, and the step of switching the signal coupled from the pattern generator outputs to the P/Es involves mapping at least two signals from of any of the pattern generator outputs to one of the T/Fs.

In another embodiment, the pattern generator includes logic vector memory (LVM) for testing logic circuits, and an algorithmic pattern generator (APG) for testing memory arrays. In this embodiment, the step of coupling a signal from the pattern generator outputs to the P/Es involves coupling signals from the LVM and the APG to separate or the same P/Es, thereby enabling simultaneous testing of one or more DUTs having both logic circuits, memory arrays or both.

In yet another embodiment, the step of coupling a signal to the P/E includes the step of sequentially coupling signals from pattern generator outputs to one of the P/Es to test a DUT having a serial input. In one version of this embodiment, signals are simultaneously coupled from a number of the pattern generator outputs to other pins on the DUT to test DUTs having both serial and parallel inputs, such as NAND flash memories.

The advantages of the present invention include: (i) the ability to couple any output on a pattern generator to any pin on a DUT, and to switch the signal coupled to the pin at least twice in each clock cycle; (ii) the ability to have a plurality of mappings selectable on a cycle-by-cycle basis; (iii) the ability to quickly and easily reconfigure the apparatus or test site to test one or more DUTs having logic circuits, memory arrays or both; (iv) the ability to quickly and easily reconfigure the test site to test one or more DUTs having serial data paths by serializing test signals generated in parallel using the pin scrambler and coupling them to any pin on a DUT; (v) the ability to quickly and easily reconfigure the test site to test DUTs having serial data paths, parallel data paths or both; (vi) the ability to quickly and easily reconfigure the test site to route serial scan memory to any pin or set of pins on a DUT, and change the routing at least twice in each clock cycle; (vii) the ability to quickly and easily reconfigure the test site to simultaneously test in parallel multiple DUTs each having a number of pins less than half the available P/E channels by mapping the same pattern generator outputs to multiple sets of P/E channels; and (viii) the ability to quickly and easily link multiple test sites to enable the testing of a DUT having a number of pins greater than the number of the P/Es available on any one or more of the individual test sites.

BRIEF DESCRIPTION OF THE DRAWINGS

These and various other features and advantages of the present invention will be apparent upon reading of the following detailed description in conjunction with the accompanying drawings, where.

DETAILED DESCRIPTION

The present invention is directed to a method and apparatus for high speed testing of integrated circuits (ICs) having either logic circuits, memory arrays or both.

Figure 3:
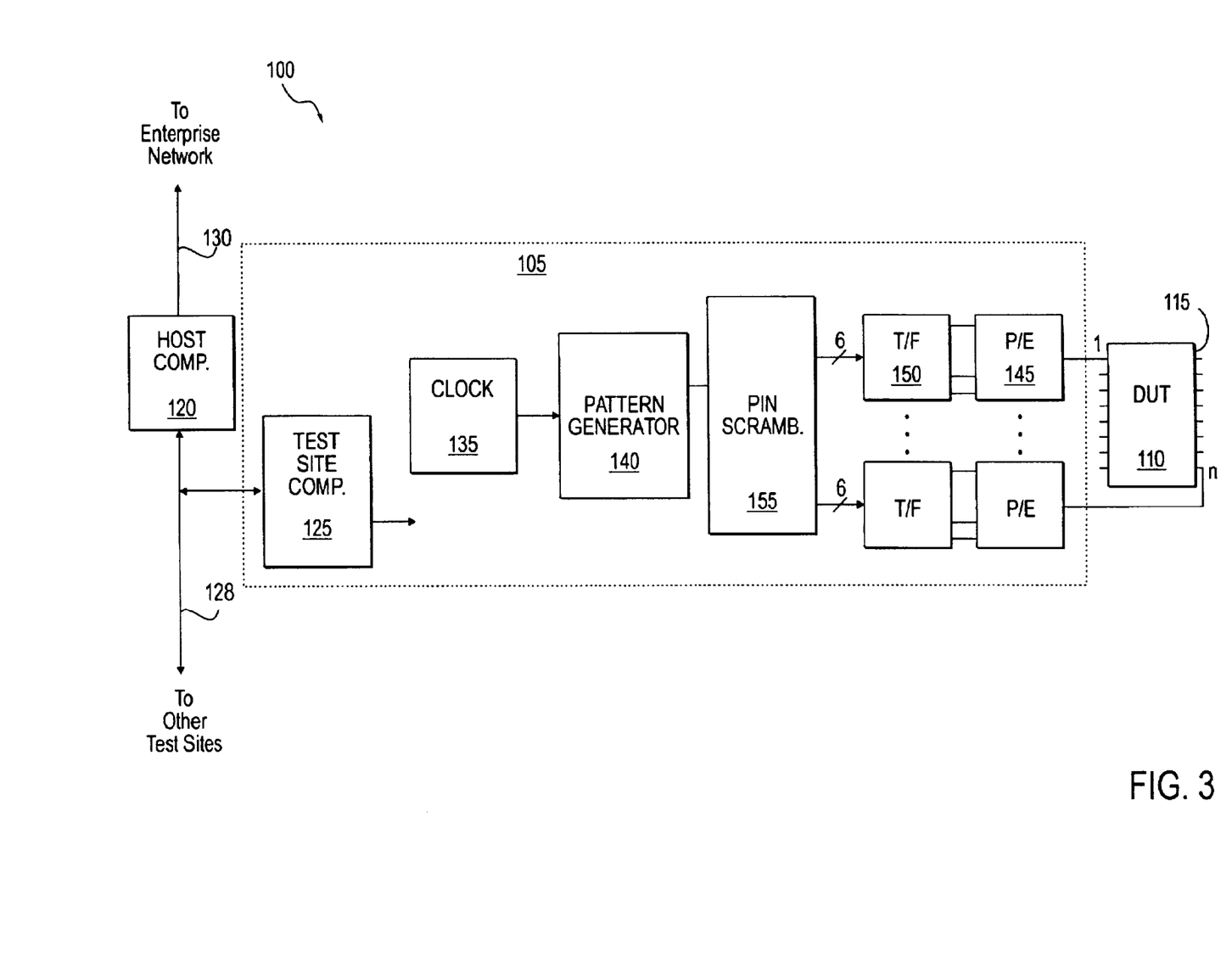
FIG. 3 is a block diagram of a test system having a single test site with double data rate (DDR) pin scrambling according to an embodiment of the present invention.

A test system according to the present invention will now be described with reference to FIG. 3. FIG. 3 is a block diagram of a test system 100 having a single apparatus or test site 105 for testing one or more devices under test (DUT 110) according to an embodiment of the present invention. By DUT 110 it is meant any electronic component module or an IC having logic circuits, memory arrays or both. DUT 110 can be a die, packaged or can be one of a number of devices on a substrate. DUT 110 can be coupled to test system 100 via a number of pins 115 or via probes (not shown) contacting pads on the substrate (not shown). While shown as having only one test site 105, it will be appreciated that test system 100 can include multiple test sites for parallel testing of a larger number of devices than can be accommodated on a single test site, or for testing a number of DUTs 110 with a larger number of pins 115 than available on one or more test sites.

Referring to FIG. 3, test system 100 includes, in addition to test site 105, a general purpose host computer 120 or PC. Host computer 120 performs housekeeping functions such as downloading test programs to a test site computer 125 in test site 105, receiving results of device tests, and aiding in linking multiple test sites within a single test system, or linking multiple test systems (not shown) within a facility. Host computer 120 can be connected via network connection 128 to other test sites (not shown in this figure) as described infra. Host computer 120 can also be connected via an ethernet connection to a separate Local Area Network or a facility wide enterprise network 130 to track operation of test system 100 and/or results of device tests.

Generally, test site 105 includes, in addition to test site computer 125, a clock 135, a test signal source or pattern generator 140, a number of pin electronic (PE) circuits or channels 145, a number of timing generators and format circuits (T/Fs 150), and a pin scrambling circuit 155 coupled between the pattern generator and the T/Fs. 150. The test site computer 125 is special purpose computer coupled to every other component or element in test site 105 for controlling the operation thereof. Clock 135 provides a timing or clock signal having a clock cycle to pattern generator 140 and T/Fs 150. Pattern generator 140 includes a number of outputs (not shown in this figure) each having an output capable of outputting a distinct test signal for testing DUT 110. PE channels 145 couple the test signals, each including a drive/expect data signal, a strobe control signal and an Input/Output (I/O) control signal, to pins 115 on DUT 110. In accordance with the present invention, pin scrambling circuit 155 couples any one of the outputs of pattern generator 140 to any one of T/Fs 150, and through the T/F to any one of pins 115 on DUT 110. Thus, test site 105 of the present invention enables the output or test signal coupled to a particular pin 115 on DUT 110 to be switched or changed "on the fly" without rewiring of the test site, a connection to the DUT or extensive reprogramming of pattern generator 140. More preferably, pin scrambling circuit 155 couples at least two outputs to each T/F 150, thereby enabling the T/F to switch the output coupled to each pin 115 on DUT 110 at least twice in each clock cycle.

Figure 4:
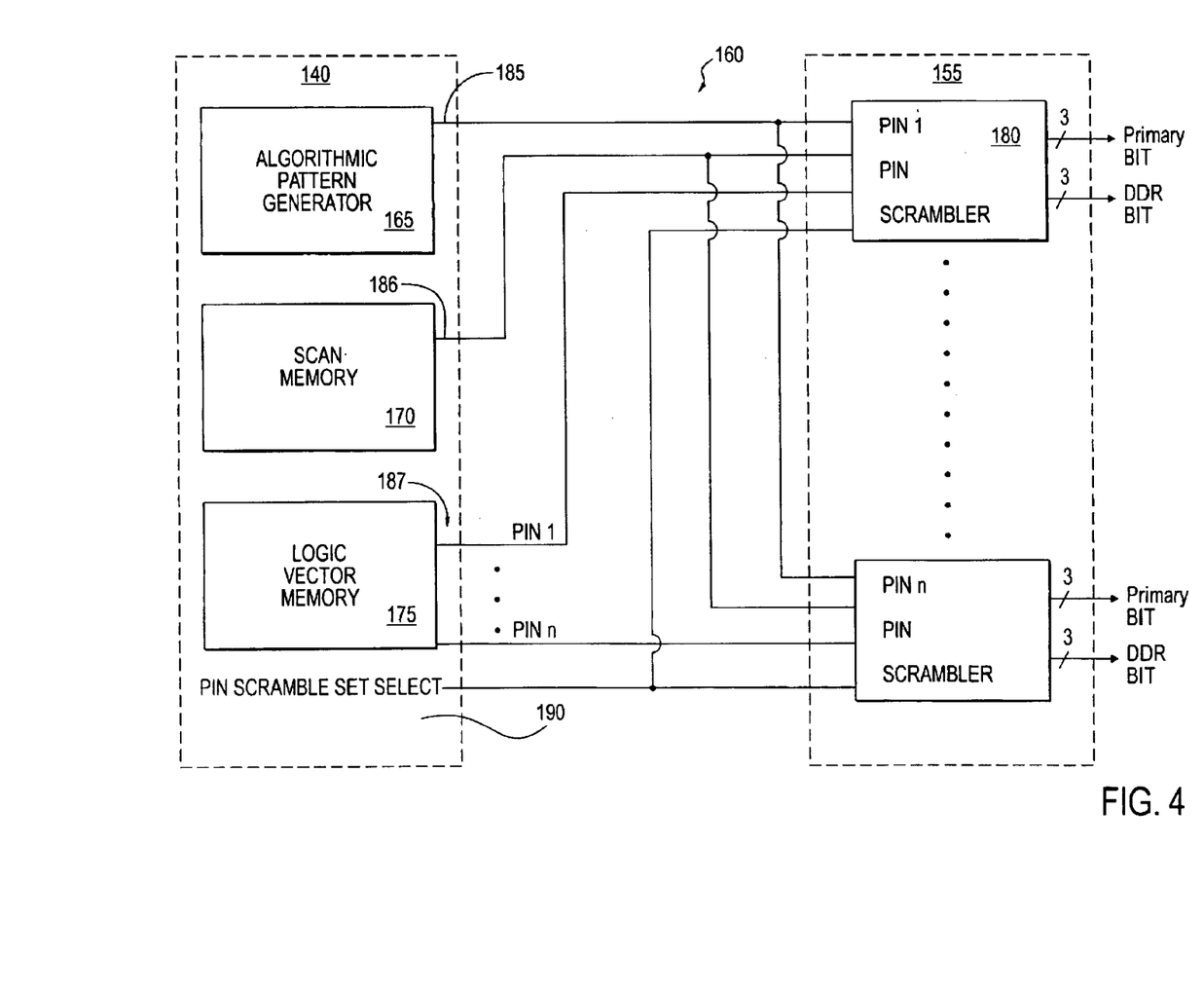
FIG. 4 is a partial block diagram of the test site of FIG. 3 showing a detailed block diagram of the pattern generator and the DDR pin scrambling circuit according to an embodiment of the present invention.
Figure 5:
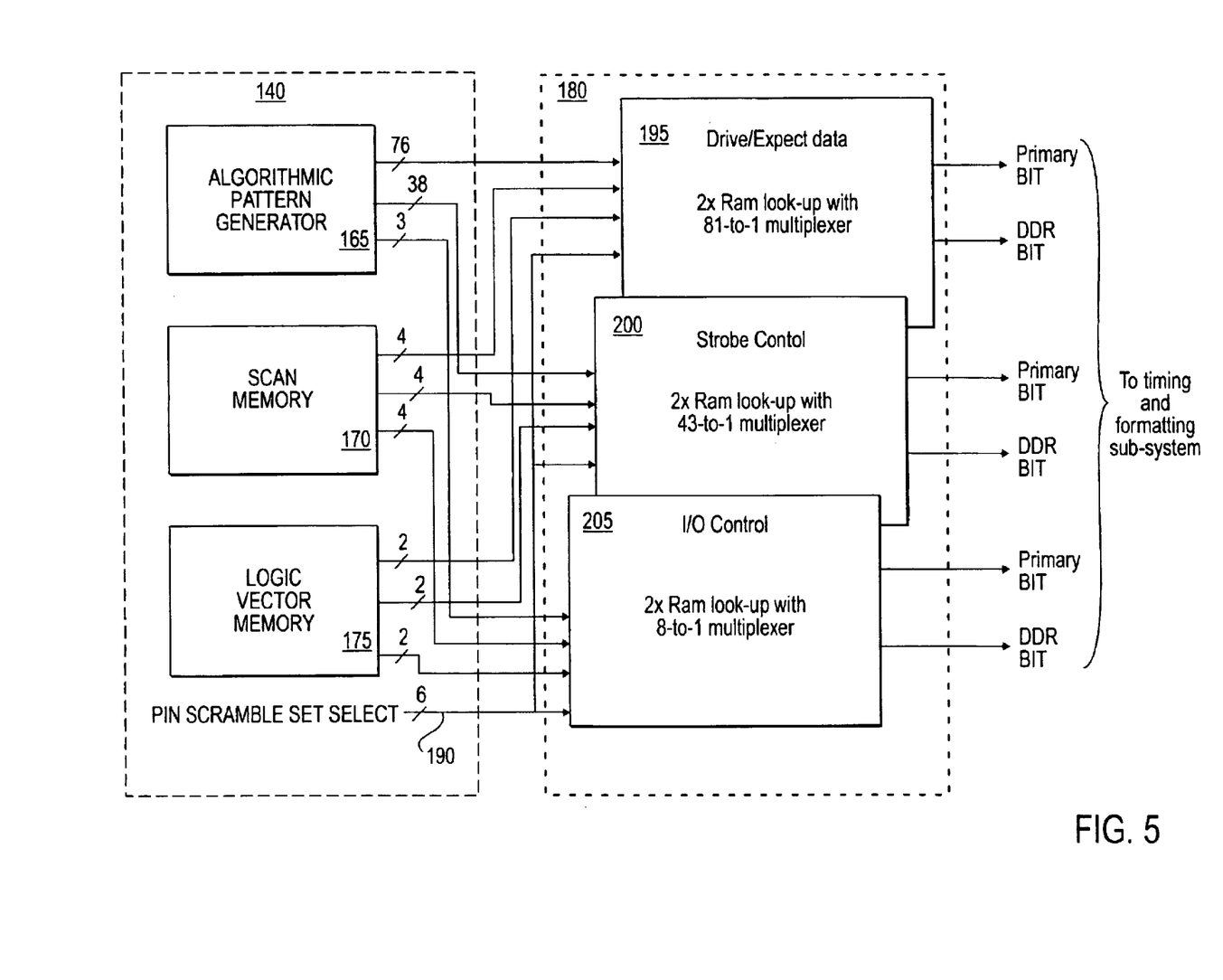
FIG. 5 is a partial block diagram of the test site of FIG. 3 showing a detailed block diagram of the pattern generator and a DDR pin scrambler for a single pin according to an embodiment of the present invention.

The component or elements of test site 105 will now be described in more detail with reference to FIGS. 4, 5 and 6. FIG. 4 is a partial block diagram of test site 105 of FIG. 3 showing details of pattern generator 140 and pin scrambling circuit 155 according to an embodiment of the present invention. Referring to FIG. 4, pattern generator 140 includes a number of circuits or generators each with outputs 160 for outputting test signals for testing DUT 110. In the embodiment shown in FIG. 4, pattern generator 140 includes an algorithmic pattern generator (APG 165) for testing DUTs 110 that include a memory circuit or array, a scan memory 170 for testing DUTs that include a serial data path and a logic vector memory (LVM 175) for testing DUTs that include a logic circuit. APG 165 provides a test signal or test vector applied in parallel across a number of pins 115 on DUT 110 for testing a memory array. Scan memory 170 provides serial test signals for testing DUTs having inputs such as used during scan testing or structural testing. LVM 175 provides logic test vectors which include data to be written to a logic circuit of DUT 110, and/or data to be read from the logic circuit.

In an alternative embodiment, not shown, the pattern generator 140 can include multiple APGs 165 to drive scrambling circuit 155, thereby providing higher speed algorithmic patterns for testing DUT 110.

Outputs 185, 186, from APG 165 and scan memory 170 respectively, each provide a test signal including a number of signals or bits. Typically, each test signal comprises three or four distinct signals or bits. For example, a test signal can have three separate bits including a data bit, a strobe bit and an I/O control bit provided over three lines per tester cycle per pin 115 to scrambling circuit 155. Scrambling circuit 155 can map at least two signals per cycle to each T/F 150.

In contrast, outputs 187 from LVM 175 provides six bits per pin 115 to scrambling circuit 155. In the embodiment shown six lines, or two bits, are mapped by scrambling circuit 155 to each T/F 150 including a first or primary bit and a second or double data rate DDR bit. In accordance with the present invention, T/Fs 150 can switch the bit applied to each pin 115 through an associated PE channel 145 at least twice in each clock cycle.

Pin scrambling circuit 155 includes a number of pin scramblers 180, one for each T/F 150. Generally, pin scrambler includes switching elements or circuits, such as multiplexers, crossbar switches or switching fabric, and is capable of connecting any one of a predetermined number of inputs (outputs 185, 186, 187) to a predetermined number of outputs (T/Fs 150). A pin scramble set select 190 controls which outputs 185, 186, 187, are coupled to a particular T/F 150.

In the embodiment shown each pin scrambler 180, shown here as PIN scrambler 1 through n, couples at least two outputs 185, 186, 187, from APG 165, scan memory 170, or LVM 175 to a single pin 115 via an associated T/F 150 and PE channel 145. However it will be understood that the number of outputs 185, 186, 187, coupled to T/Fs 150 can be increased thereby enabling the T/Fs to switch the outputs coupled to pins 115 on DUT 110 more than twice in a clock cycle.

Pin scrambler 180 will now be described in more detail with reference to FIG. 5. FIG. 5 is a partial block diagram of the test site of FIG. 3 showing details of pin scrambler 180 and its connection to APG 165, scan memory 170 and LVM 175 of pattern generator 140. Referring to FIG. 5, in one embodiment each pin scrambler 180 includes a number of multiplexers (MUXs 195, 200, 205), for coupling drive/expect data, strobe control, and I/O control data to an associated T/F 150. Drive/expect data MUX 195 comprises an 81-to-1 MUX with 2× RAM look-up for multiplexing, for example, 76 data lines from APG 165, 4 data lines from scan memory 170 and 2 from LVM 175 into a primary and a DDR bit for drive/expect data. The 2× RAM look-up includes one RAM for primary data bit MUX select and one RAM for DDR data bit MUX select. Strobe control MUX 200 comprises a 2× RAM look-up with an 43-to-1 MUX for multiplexing, for example, 38 strobe control lines from APG 165, 4 strobe control lines from scan memory 170 and 2 from LVM 175 to the primary and DDR strobe control bits applied to the associated T/F 150. I/O control data MUX 205 comprises a 2× RAM look-up with an 8-to-1 MUX for multiplexing, for example, 3 I/O control lines from APG 165, four I/O control lines from scan memory 170 and two from LVM 175 to the primary and DDR I/O control bits applied to associated T/F 150.

T/F 150 and PE channel 145 and their connection to a pin scrambler 180 and a pin 115 on DUT 110 will now be described with reference to FIG. 6. FIG. 6 is a partial block diagram of the test site of FIG. 3 showing details of a T/F 150 and PE channel 145 for a single pin 115 according to an embodiment of the present invention. T/F 150 receives from the pin scrambler 180 two complete test signals including a primary bit and a DDR bit. Each test signal includes a drive/expect data signal or bit, a strobe control signal or bit, and an I/O control signal or bit. In addition, T/F 150 also receives a six bit timing set select signal 210 from the pattern generator control logic to enable the T/F to determine which bit, the primary bit or the DDR bit, to couple to PE channel 145 during a particular portion of the clock cycle.

It should be noted that the length or duration with which each bit is applied to PE channel 145 need not be equal, nor do the times of the transitions or switching of outputs 185, 186, 187 need necessarily to correspond. T/F 150 also receives a clock signal 215 from clock 135 to enable the T/F to determine when to couple the primary bit or the DDR bit to PE channel 145. Typically, clock signal 215 includes a number of regular clock ticks or pulses and, in conjunction with timing set select signal 210, inform T/F 150 how pulses constitute a tester cycle. For example, clock signal 215 can include pulses at a frequency of 100 MHz and T/F 150 can count 100 pulses to provide a 1 microsecond tester cycle. Thus, T/F 150 can switch the unformatted output coupled to associated PE channel 145 from 2 to about 20 times a tester cycle, provided sufficient bits are coupled to the T/F by pin scrambler 180 and timing set select signal 210 includes sufficient information to enable the T/F to determine which bit or output to couple to PE channel 145 during a particular portion of the clock cycle.

Figure 6:
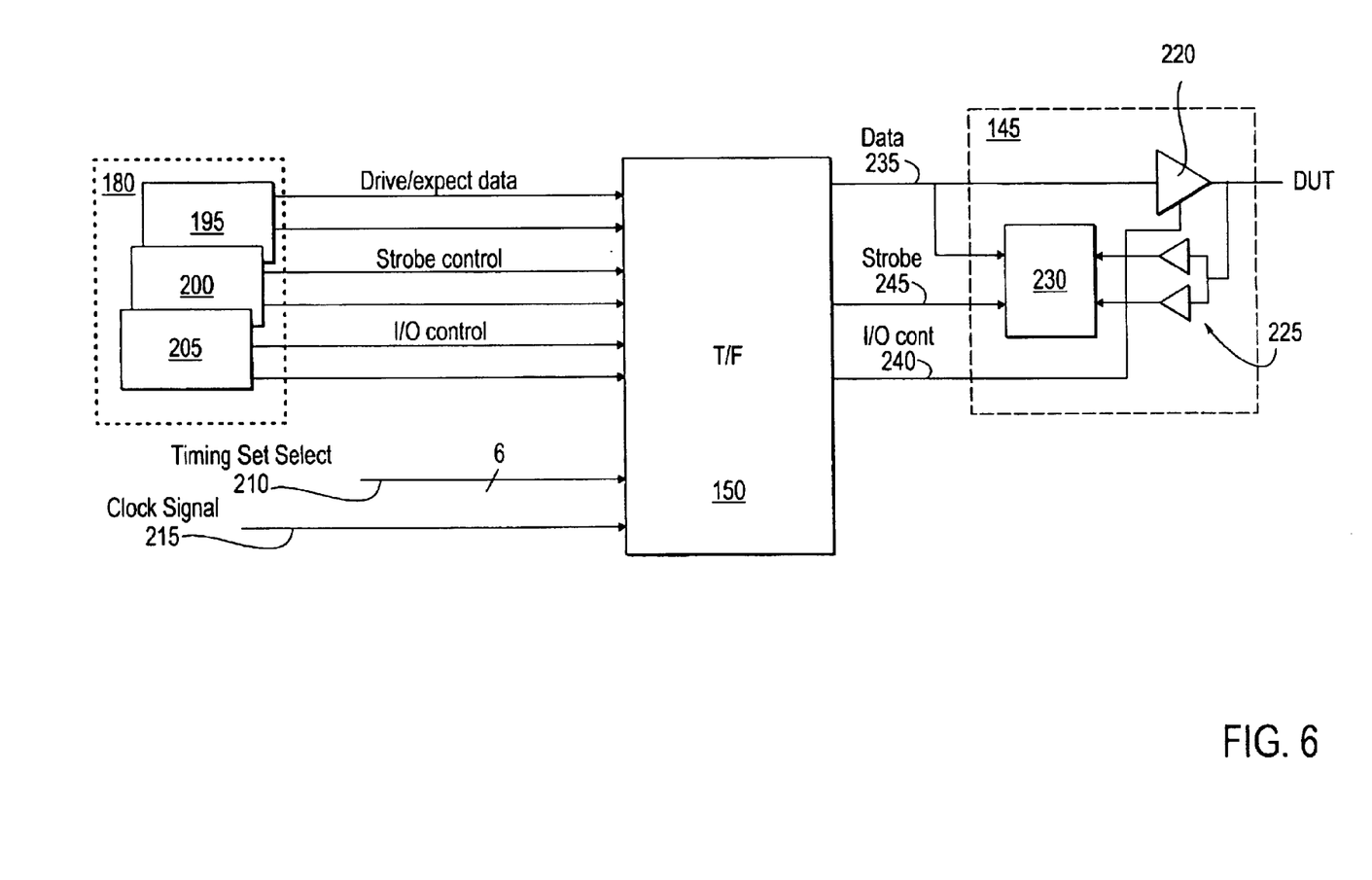
FIG. 6 is a partial block diagram of the test site of FIG. 3 showing a detailed block diagram of the DDR pin scrambler, timing and format circuit, and pin electronics for a single pin according to an embodiment of the present invention.

Referring to FIG. 6, each PE channel typically includes PE driver 220 for coupling drive/expect data to a pin 115 of DUT 110, a comparator 225 for comparing an output signal with an expected output signal, and an error logic circuit 230 for coupling results of the comparison back to pattern generator 140 and an error capture memory (not shown). Generally, PE driver 220 and comparator 225 are not active in the same PE channel at the same time, since pin 115 is either receiving data or control signals or transmitting a result at a given time. PE channels 145 further include a data line 235 for coupling the test vectors from T/F 150 to PE driver 220 and error logic 230, an enable or control line 240 for enabling the PE driver to apply the test vector to DUT 110, and a strobe line 245 for enabling comparator 225.

Figure 7:
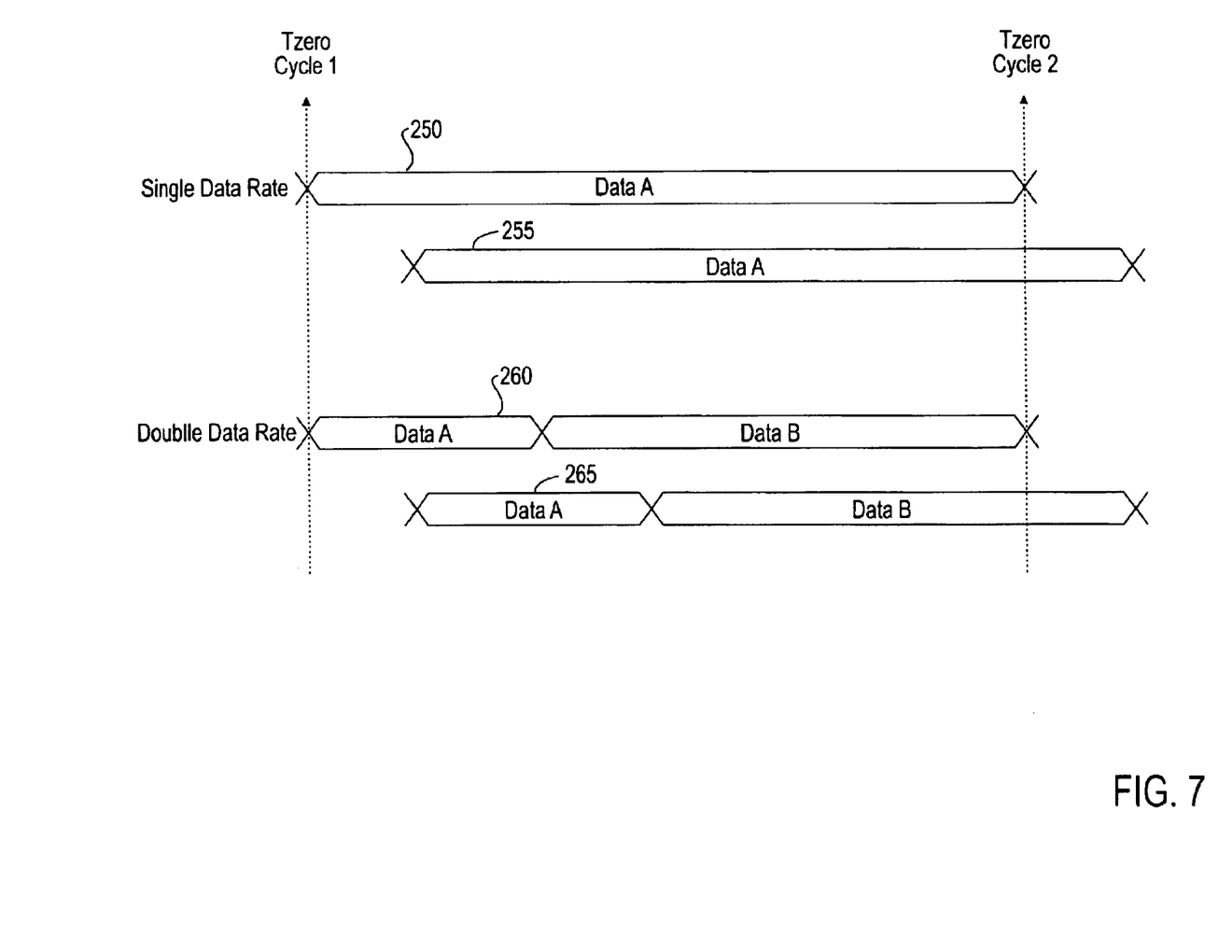
FIG. 7 is a timing diagram illustrating DDR pin scrambling according to an embodiment of the present invention.
Figure 8:
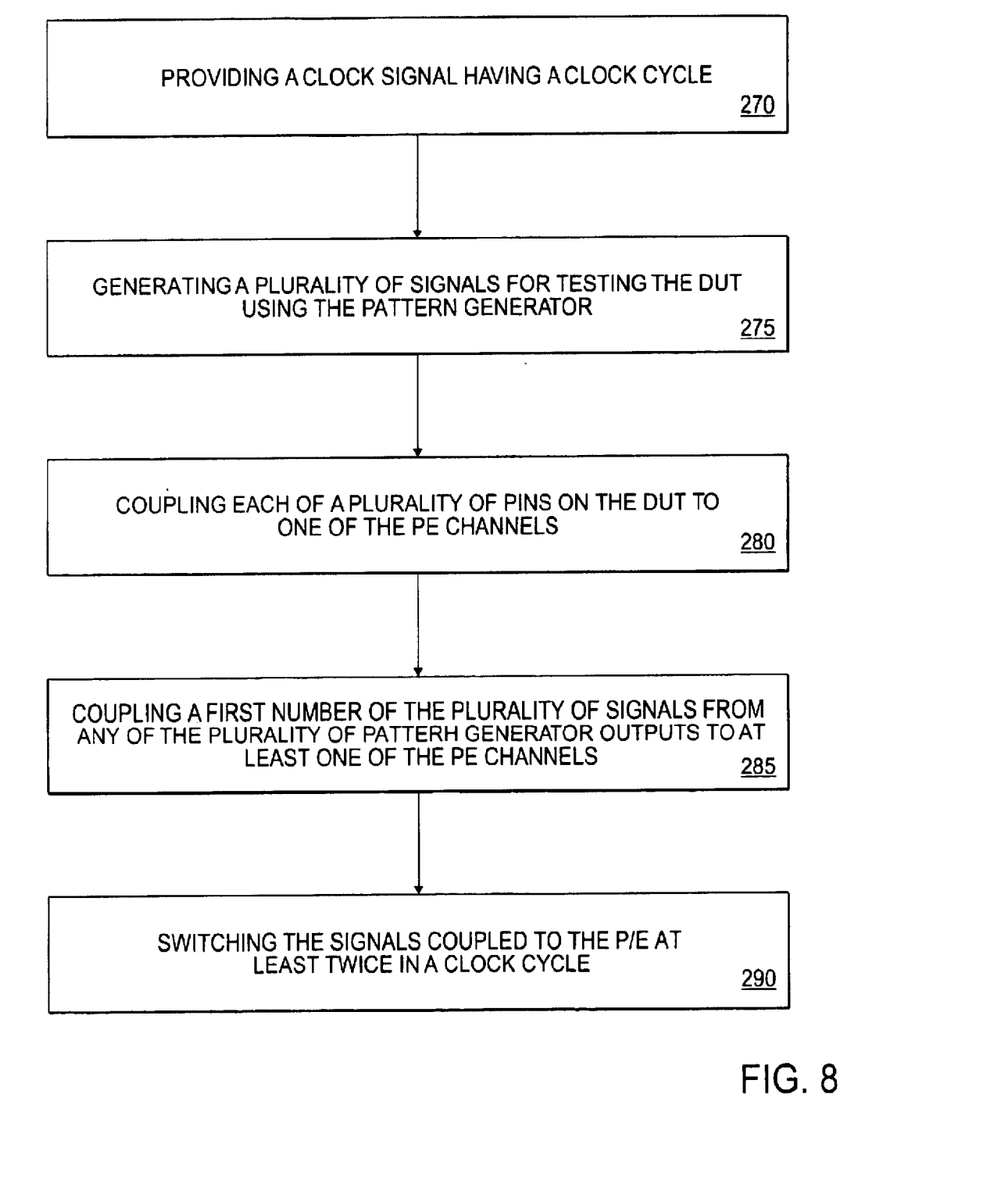
FIG. 8 is a flow chart showing steps of a method for testing an integrated circuit according to an embodiment of the present invention.

In another aspect, a method is provided for testing DUT 110 at a frequency greater than that of the clock 135. An embodiment of the invention will now be described with reference to FIGS. 7 and 8. FIG. 7 is a timing diagram illustrating relative timing for application of data bits to PE channels 145 at a single data rate and at DDR. FIG. 8 is a flow chart showing steps of a method for testing DUT 110 according to an embodiment of the present invention.

Referring to FIG. 7, for a conventional test system operating at a single data rate, shown by graph 250 in the top of FIG. 7, it is seen that a test signal or an output, DATA A is applied to a particular pin at the beginning of the clock cycle, $T_{zero}$, and the same signal continues to be applied uninterrupted for the entire clock cycle. Although conventional test systems can apply test signals to different pins beginning at different times or at times interpolated between clock pulses or clock cycles, as indicated by graph 255, only one test signal or output can be coupled to a pin during a clock cycle. In contrast, for test system 100 shown in FIG. 3 and operating at a double data rate, shown in the lower half of FIG. 7, it is seen from graph 260 that a first test signal or output, DATA A, can be coupled to pin 115 at $T_{zero}$ and a second signal or output, DATA B can be coupled to the pin at a later time before $T_{zero}$ of the next cycle. It should be noted that as indicated by graph 265, test system 100 and the method of the present invention can also apply test signals to different pins beginning at different times or at times interpolated between clock pulses or clock cycles.

A method of operating test system 100 to switch test signals or outputs 185, 186, and 187, coupled to a particular PE channel 145 or pin 115 on a DUT will now be described with reference to FIG. 8. In the method, clock signal 215 is generated using clock 135 (step 270), and signals for testing DUT 110 generated using pattern generator 140 (step 275). Each of pins 115 on DUT 110 are connected to one of PE channels 145 (step 280), and a first number of signals from any of the number of pattern generator outputs 185, 186, 187, is coupled to at least one of the PE channels (step 285). The signals or outputs coupled to PE channels 145 are switched at least twice each clock cycle (step 290), thereby providing an effective testing rate at least twice that of the clock cycle.

Alternative embodiments or configurations of test system 100 according to the present invention will now be described with reference to FIGS. 9 and 10.

Figure 9:
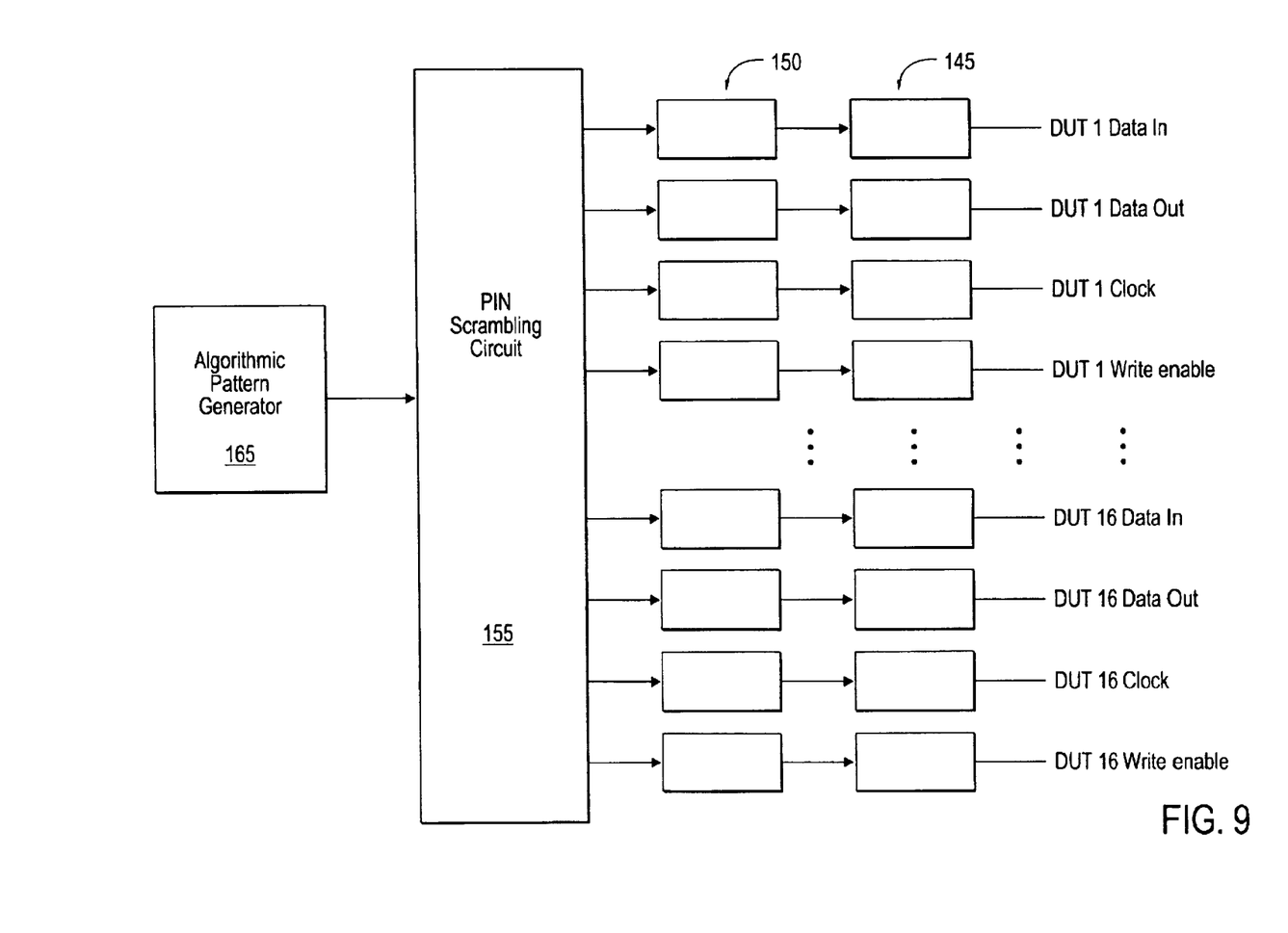
FIG. 9 is an exemplary setup for parallel testing of sixteen 4-pin serial memory devices using a 64-pin test site according to an embodiment of the present invention.

Referring to FIG. 9, an exemplary setup for parallel testing of sixteen 4-pin serial memory devices using a 64-pin test site according to an embodiment of the present invention is shown. In this embodiment, a test signal from APG 165 is coupled through pin scrambling circuit 155 to T/Fs 150 and PE channels 145 to pins 115 on the DUTs. An advantage of this setup is that an operator or test engineer need not write or duplicate a test program for each individual DUT 110. One added line of code per pin is sufficient for test site computer 125 to instruct pin scrambler 155 to apply the same test vector to each DUT 110.

Figure 10:
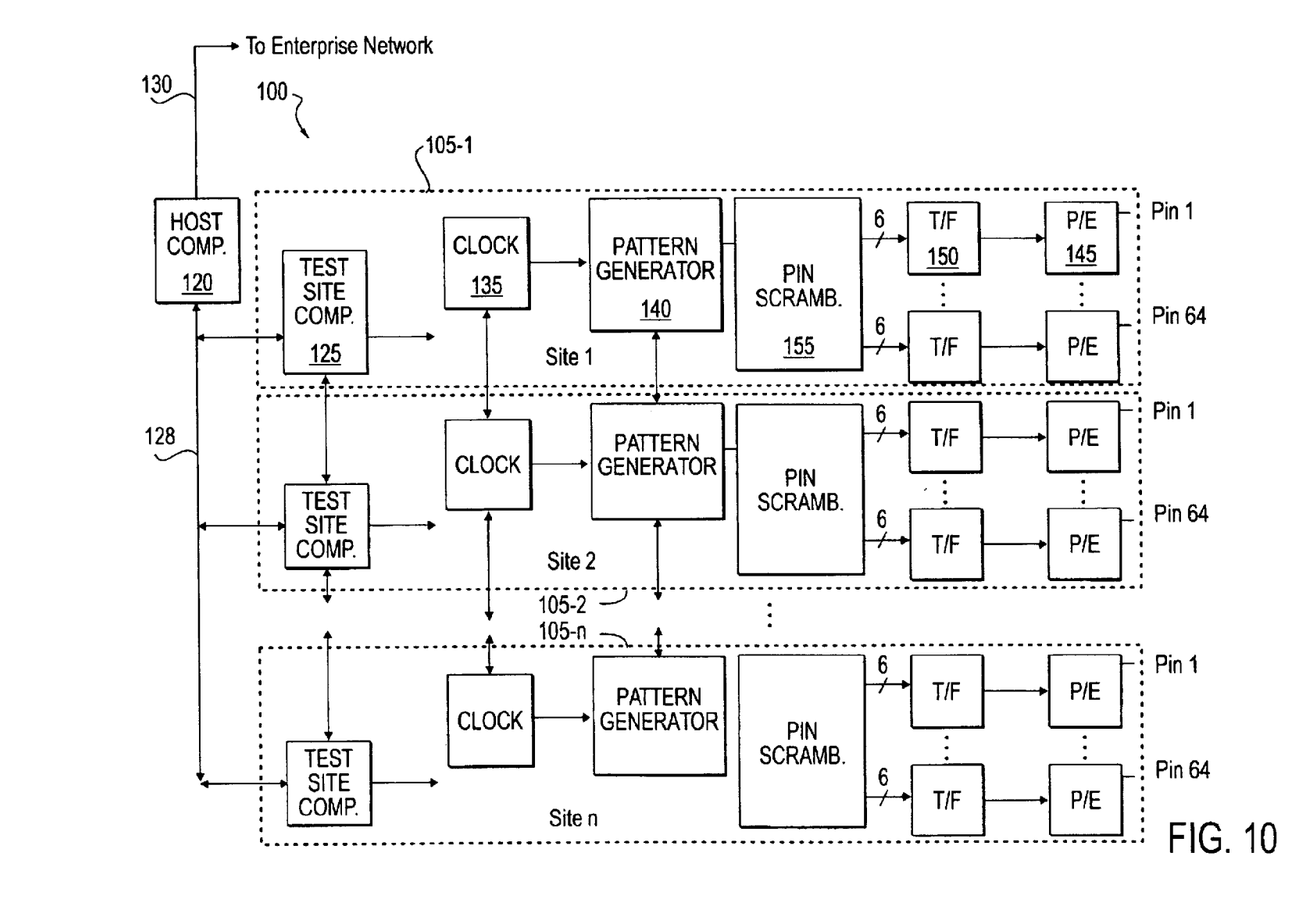
FIG. 10 is a block diagram of a test system having a plurality of test sites linked according to an embodiment of the present invention for testing a device having a number of pins greater than pin channels available on one or more test sites.

FIG. 10 is a block diagram of test system 100 including a plurality of test sites 105 linked according to an embodiment of the present invention to enable testing of a DUT 110 having a number of pins 115 greater than PE channels 145 available on any one test site 105 or multiple test sites. For example, a five-hundred pin DUT 110 can be tested by linking eight test sites 105 each having sixty-four PE channels 145. In this embodiment, test site computer 125 includes a program with program code for determining if test system 100 comprises multiple test sites 105-1, 105-n, each having a test site computer 125 associated therewith. If test system 100 comprises multiple computers 125, the computer program selects one of test site computers 125 to control the linked test sites 105-1, 105-n, and for idling the remainder of the test site computers. The computer program also includes program code for synchronizing pattern generators 140 and clocks 135 in each of the test sites 105-1, 105-n to run in parallel.

It is to be understood that even though numerous characteristics and advantages of certain embodiments of the present invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed.

What is claimed is:

1. An apparatus for testing a device under test (DUT), the apparatus comprising:
   a pattern generator having a plurality of pattern generator outputs capable of outputting signals for testing the DUT;
   a plurality of pin electronics channels (P/Es) each coupling to one of a plurality of pins on the DUT;
   a plurality of timing and format circuits (T/Fs) each capable of mapping a signal to one of the plurality of P/Es;
   a pin scrambling circuit coupled between the pattern generator and the plurality of T/Fs, the pin scrambling circuit capable of mapping at least two signals from any of the plurality of pattern generator outputs to any one of the plurality of T/Fs; and
   a clock capable of providing a clock signal having a clock cycle to the pattern generator and to the plurality of T/Fs,
   wherein each of the plurality of T/Fs are capable of switching the signal coupled to one of the plurality of P/Es at least twice in a clock cycle.

2. An apparatus according to claim 1, wherein the signal mapped to one of the plurality of P/Es includes a plurality of bits, n, and wherein the at least two signals mapped from the pattern generator outputs to the T/F includes at least two signals each having n bits.

3. An apparatus according to claim 2, wherein the plurality of bits is selected from a group consisting of:
   drive/expect data bits;
   strobe control bits; and
   Input/Output (I/O) control bits.

4. An apparatus according to claim 1, wherein the pattern generator comprises logic vector memory (LVM) for testing logic circuits, and an algorithmic pattern generator (APG) for testing memory arrays, and wherein the scrambling circuit is capable of mapping signals from the LVM and the APG to separate T/Fs,
   whereby the apparatus is capable of simultaneously testing logic circuits and memory arrays in a DUT having both.

5. An apparatus according to claim 4, wherein the apparatus is capable of testing multiple DUTs including DUTs having logic circuits and DUTs having memory arrays simultaneously.

6. An apparatus according to claim 1 wherein the pattern generator comprises scan memory.

7. An apparatus according to claim 1, wherein the pin scrambling circuit is capable of sequentially coupling, via one of the plurality of T/Fs, a number of signals from the plurality of pattern generator outputs to one of the plurality of pins on the DUT to test a DUT selected from the group consisting of:
   DUTs having at least one serial input;
   DUTs having at least one serial output; and
   DUTs having both a serial input and a serial output.

8. An apparatus according to claim 7, wherein the pin scrambling circuit is capable of simultaneously coupling, via the plurality of T/Fs, a number of the plurality of signals from the pattern generator outputs to other pins on the DUT, and wherein the DUT is selected from the group consisting of:
   DUTs having at least one parallel input;
   DUTs having at least one parallel output; and
   DUTs having both a parallel input and a serial output.

9. An apparatus according to claim 1, wherein the pin scrambling circuit comprises a circuit selected from a group consisting of:
   multiplexers;
   crossbar switches; and
   switching fabric.

10. A test system comprising a plurality of the apparatuses of claim 1, wherein the clocks and pattern generators of the plurality of the apparatuses are linked to enable the testing of a DUT having a number of pins at least greater than the plurality of the P/Es on any one of the plurality of the apparatuses.

11. A method for testing a device under test (DUT) using an apparatus including a clock, a pattern generator having a plurality of pattern generator outputs, and a plurality of pin electronics channels (P/Es), the method comprising steps of:
   providing a clock signal having a clock cycle using the clock;
   providing signals for testing the DUT on the plurality of pattern generator outputs using the pattern generator;
   coupling each of a plurality of pins on the DUT to one of the P/Es;
   coupling at least one signal to at least one of the P/Es; and
   switching the at least one signal coupled to the at least one of the P/Es at least twice in a clock cycle.

12. A method according to claim 11, wherein the apparatus further includes a plurality of timing and format circuits (T/Fs) each coupled between the pattern generator and one of the plurality of P/Es, and wherein the step of coupling at least one signal to at least one of the P/Es comprises the step of coupling at least one signal from the at least one of the plurality of T/Fs to at least one of the P/Es.

13. A method according to claim 12, wherein the apparatus further includes a pin scrambling circuit coupled between the pattern generator and the plurality of T/Fs, and wherein the step of switching the at least one signal coupled to the at least one of the P/Es at least twice in a clock cycle comprises the steps of mapping at least two signals from of any of the plurality of pattern generator outputs to at least one of the plurality of T/Fs, and switching the at least one signal coupled to the at least one of the P/Es from the at least one of the plurality of T/Fs at least twice in a clock cycle.

14. A method according to claim 11, wherein the pattern generator comprises logic vector memory (LVM) for testing logic circuits, and an algorithmic pattern generator (APG) for testing memory arrays, and wherein the step of coupling at least one signal to at least one of the P/Es comprises the step of coupling signals from the LVM and the APG to separate P/Es thereby enabling simultaneous testing of a DUT having both logic circuits and memory arrays.

15. A method according to claim 14, wherein the apparatus is capable of testing multiple DUTs including DUTs having logic circuits and DUTs having memory arrays simultaneously, and wherein the step of coupling at least one signal to at least one of the P/Es comprises the steps of:
   coupling at least one signal from the LVM to at least one of the P/Es coupled to one of a plurality of pins on a DUT having logic circuits; and
   coupling at least one signal from the APG to at least one of the P/Es coupled to one of a plurality of pins on a DUT having memory arrays.

16. A method according to claim 11, wherein the pattern generator comprises logic vector memory (LVM) for testing logic circuits, and an algorithmic pattern generator (APG) for testing memory arrays, and wherein the step of coupling at least one signal to at least one of the P/Es comprises the step of coupling signals from the LVM and the APG to the same P/E thereby enabling simultaneous testing of a DUT having both logic circuits and memory arrays.

17. A method according to claim 11, wherein the pattern generator comprises scan memory, and wherein the step of coupling at least one signal to at least one of the P/Es comprises the step of coupling at least one signal from the scan memory to at least one of the P/Es.

18. A method according to claim 11, wherein the method further comprises the step of sequentially coupling signals from the plurality of pattern generator outputs to one of the P/Es to test a DUT selected from the group consisting of:

DUTs having at least one serial input;

DUTs having at least one serial output; and

DUTs having both a serial input and a serial output.

19. A method according to claim 18, wherein the method further comprises the step of simultaneously coupling signals from the plurality of pattern generator outputs to other P/Es coupled to other pins on the DUT, and wherein the DUT is selected from the group consisting of:

DUTs having at least one parallel input;

DUTs having at least one parallel output; and

DUTs having both a parallel input and a serial output.

20. A semiconductor device tested according to the method of claim 11.

21. An apparatus for testing a device under test (DUT), the apparatus comprising:

pattern generating means for generating signals for testing the DUT, the pattern generating means having a plurality of outputs;

a plurality of first coupling means for coupling with a plurality of pins on the DUT;

a plurality of second coupling means for coupling at least one signal from the plurality of outputs of the pattern generating means to at least one of the plurality of first coupling means;

mapping means for mapping at least two signals from the pattern generating means to any one of the plurality of second coupling means; and clocking means for providing a clock signal having a clock cycle to the pattern generating means and to the plurality of second coupling means, wherein each of the plurality of second coupling means are capable of switching the signal coupled to one of the plurality of first coupling means at least twice in a clock cycle.

22. An apparatus for testing a device under test (DUT), the apparatus comprising:

a pattern generator having a plurality of pattern generator outputs each capable of outputting a signal for testing the DUT;

a plurality of pin electronics channels (P/Es) each capable of coupling a signal between one of a plurality of pins on the DUT and the apparatus;

a plurality of timing and format circuits (T/Fs) each capable of coupling a first number of pattern generator outputs to one of the plurality of P/Es;

a pin scrambling circuit coupled between the pattern generator and the plurality of T/Fs, the pin scrambling circuit capable of mapping a second number of any of the plurality of pattern generator outputs to any one of the plurality of T/Fs; and a clock capable of providing a clock signal having a clock cycle to the pattern generator and to the plurality of T/Fs, wherein the second number of pattern generator outputs is greater than the first number of pattern generator outputs, and wherein each of the plurality of T/Fs are capable of switching the pattern generator outputs coupled to one of the plurality of P/Es at least twice in a clock cycle.

23. An apparatus according to claim 22, wherein the second number of pattern generator outputs mapped to one of the plurality of T/Fs comprises at least two sets of pattern generator outputs each having a number of outputs equal to the first number of pattern generator outputs, and wherein each of the plurality of T/Fs is capable of switching the sets of outputs coupled to one of the plurality of P/Es at least twice in a clock cycle.

* * * * *